US008067966B2

(12) United States Patent
Freyman et al.

(10) Patent No.: US 8,067,966 B2
(45) Date of Patent: Nov. 29, 2011

(54) VOLTAGE CONTROLLED DELAY LOOP AND METHOD WITH INJECTION POINT CONTROL

(75) Inventors: Ronald L. Freyman, Bethlehem, PA (US); Vladimir Sindalovsky, Perkasie, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 1522 days.

(21) Appl. No.: 10/999,900

(22) Filed: Nov. 30, 2004

(65) Prior Publication Data

US 2006/0114039 A1 Jun. 1, 2006

(51) Int. Cl.
*H03L 7/00* (2006.01)

(52) U.S. Cl. .......................... 327/158; 327/161; 327/163

(58) Field of Classification Search .................. 327/149, 327/153, 158, 161, 162, 163, 291, 294, 299; 331/1 A, 25; 375/373, 375, 376
See application file for complete search history.

(56) References Cited

U.S. PATENT DOCUMENTS

| 6,377,101 | B1 * | 4/2002 | Eto et al. ........................ 327/270 |
| 6,469,559 | B2 * | 10/2002 | Heightley ...................... 327/278 |
| 6,483,360 | B2 * | 11/2002 | Nakamura ..................... 327/158 |
| 6,650,157 | B2 * | 11/2003 | Amick et al. .................. 327/158 |
| 6,680,634 | B1 * | 1/2004 | Ruha et al. ..................... 327/158 |
| 6,721,232 | B2 * | 4/2004 | Kashiwazaki ............ 365/189.15 |
| 6,737,901 | B2 * | 5/2004 | Hein et al. ...................... 327/270 |
| 6,765,976 | B1 * | 7/2004 | Oh .................................. 375/376 |
| 6,803,826 | B2 * | 10/2004 | Gomm et al. ..................... 331/11 |
| 6,836,164 | B1 * | 12/2004 | Wang et al. .................... 327/156 |
| 6,927,611 | B2 * | 8/2005 | Rhee et al. ..................... 327/149 |
| 6,970,020 | B1 * | 11/2005 | Mei et al. ........................... 327/3 |
| 7,024,324 | B2 * | 4/2006 | Rifani et al. ..................... 702/79 |
| 7,123,064 | B2 * | 10/2006 | Parikh ............................ 327/149 |
| 7,173,459 | B2 * | 2/2007 | Freyman et al. .............. 327/149 |
| 7,190,198 | B2 * | 3/2007 | Freyman et al. .............. 327/149 |
| 7,206,369 | B2 * | 4/2007 | Findley et al. ................. 375/373 |
| 7,336,752 | B2 * | 2/2008 | Vlasenko et al. .............. 375/376 |
| 7,495,494 | B2 * | 2/2009 | Freyman et al. .............. 327/270 |
| 7,765,078 | B2 * | 7/2010 | Mobin et al. ..................... 702/89 |
| 2004/0125905 | A1 * | 7/2004 | Vlasenko et al. .............. 375/376 |
| 2005/0242868 | A1 * | 11/2005 | Lutkemeyer .................. 327/298 |
| 2006/0114039 | A1 * | 6/2006 | Freyman et al. .............. 327/161 |
| 2006/0222123 | A1 * | 10/2006 | Mobin et al. ................... 375/348 |

FOREIGN PATENT DOCUMENTS

WO WO 97/14214 4/1997

* cited by examiner

*Primary Examiner* — Thomas J Hiltunen
(74) *Attorney, Agent, or Firm* — Ryan, Mason & Lewis, LLP

(57) ABSTRACT

A voltage controlled delay loop and method are disclosed for clock and data recovery applications. The voltage controlled delay loop generates clock signals having similar frequency and different phases. The voltage controlled delay loop comprises a plurality of delay elements; and an input that selectively injects a reference clock into any one of the plurality of delay elements. The plurality of delay elements are connected in series, such as in a loop. In one exemplary implementation, each delay element has an associated multiplexer that selects one of the reference clock and a signal from a previous delay element.

21 Claims, 3 Drawing Sheets

VOLTAGE CONTROLLED DELAY LOOP AND METHOD WITH INJECTION POINT CONTROL

CROSS-REFERENCE TO RELATED APPLICATIONS

The present invention is related to U.S. patent application Ser. No. 10/999,889, entitled "Voltage Controlled Delay Loop with Central Interpolator," filed contemporaneously herewith and incorporated by reference herein.

FIELD OF THE INVENTION

The present invention is related to techniques for clock and data recovery (CDR) and, more particularly, to methods and apparatus for digital control of the generation and selection of different phases of a clock signal.

BACKGROUND OF THE INVENTION

In many applications, including digital communications, clock and data recovery (CDR) must be performed before data can be decoded. Generally, in a digital clock recovery system, a reference clock signal of a given frequency is generated together with a number of different clock signals having the same frequency but with different phases. In one typical implementation, the different clock signals are generated by applying the reference clock signal to a delay network. Thereafter, one or more of the clock signals are compared to the phase of an incoming data stream and one or more of the clock signals are selected for data recovery.

A number of existing digital CDR circuits use voltage controlled delay loops (VCDL) to generate a number of clocks having the same frequency and different phase for data sampling (i.e., oversampling). For example, published International Patent Application No. WO 97/14214, discloses a compensated delay locked loop timing vernier. The disclosed timing vernier produces a set of timing signals of similar frequency and evenly distributed phase. An input reference clock signal is passed through a succession of delay stages. A separate timing signal is produced at the output of each delay stage. The reference clock signal and the timing signal output of the last delay stage are compared by an analog phase lock controller. The analog phase lock controller controls the delay of all stages so that the timing signal output of the last stage is phase locked to the reference clock. Based on the results of the oversampled data, the internal clock is delayed so that it provides data sampling adjusted to the center of the "eye." The phase of the VCDL is adjusted to keep up with phase deviations of the incoming data.

While such voltage controlled delay loops effectively generate the sampling clocks and control the delay stages to maintain alignment of the reference clock signal and the last timing signal, they suffer from a number of limitations, which if overcome, could further improve the utility of such voltage controlled delay loops. For example, the analog implementation of the phase lock controller is complex and generally cannot be easily ported from one technology to another. In addition, digital-to-analog conversion is required to convert the digital phase adjustment control into analog signal control. A need therefore exists for voltage controlled delay loops with digital phase control.

SUMMARY OF THE INVENTION

Generally, a voltage controlled delay loop and method are disclosed for clock and data recovery applications. The voltage controlled delay loop generates clock signals having similar frequency and different phases. The voltage controlled delay loop comprises a plurality of delay elements; and an input that selectively injects a reference clock into any one of the plurality of delay elements. The plurality of delay elements are connected in series, such as in a loop. In one exemplary implementation, each delay element has an associated multiplexer that selects one of the reference clock and a signal from a previous delay element.

The injection point control of the present invention allows a desired phase relationship to be maintained between the reference clock and a sample clock. The granularity of the disclosed voltage controlled delay loop is equal to the delay associated with each delay element.

A more complete understanding of the present invention, as well as further features and advantages of the present invention, will be obtained by reference to the following detailed description and drawings.

DETAILED DESCRIPTION

The present invention provides voltage controlled delay loops with digital phase control. The present invention controls the phase offset from the reference clock to the data sampling clock by shifting the injection point of the reference clock into the voltage controlled delay loop.

Figure 1:
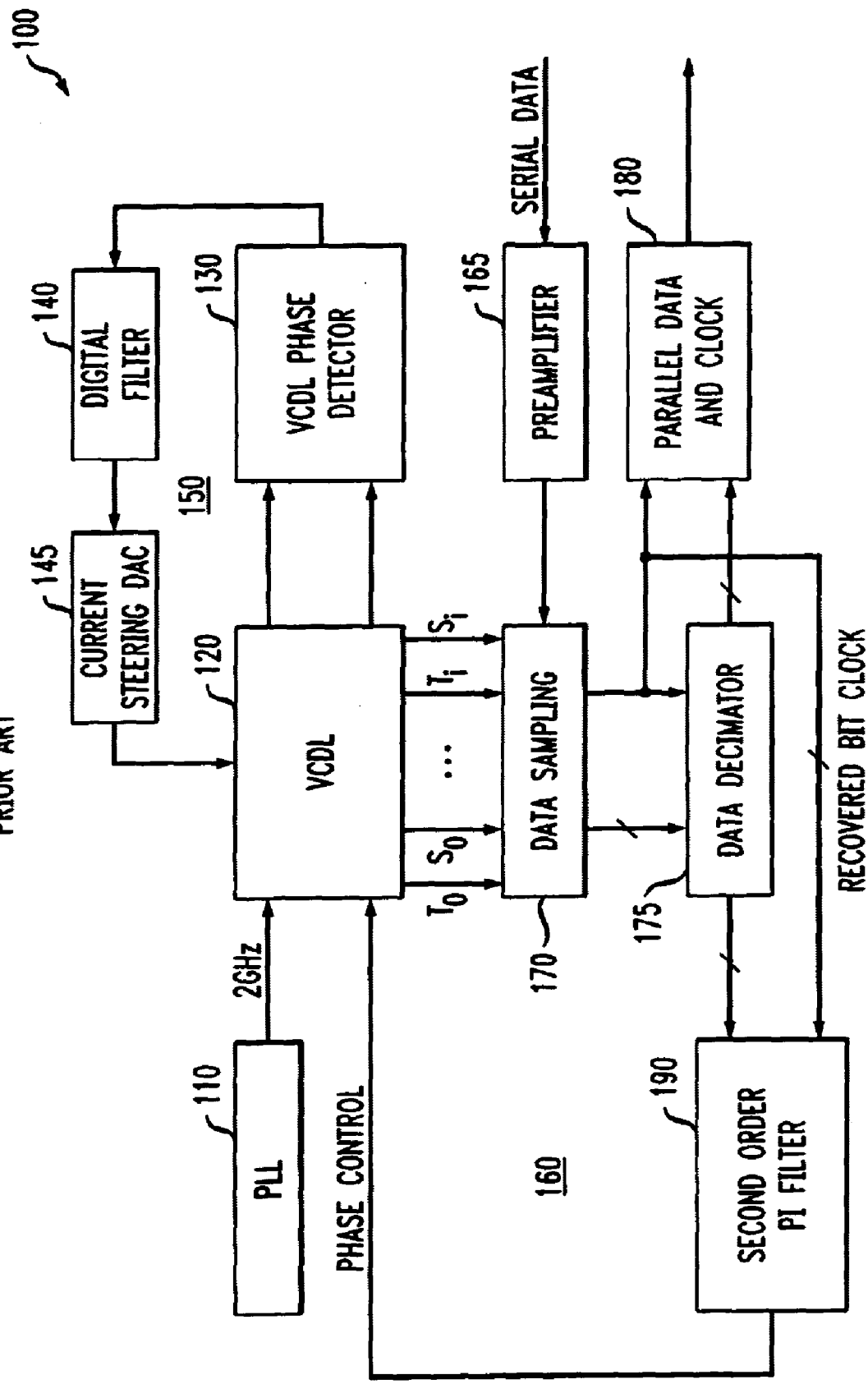
FIG. 1 illustrates an exemplary conventional clock recovery circuit.

FIG. 1 illustrates an exemplary conventional clock recovery circuit 100. As shown in FIG. 1, the clock recovery circuit 100 produces a clock signal with a predetermined number of phases, $T_0, S_0, \ldots T_i, S_i$, discussed below in conjunction with FIG. 2. The exemplary clock recovery circuit 100 includes a reference clock signal (for example, 2 GHz) generated by a phase locked loop (PLL) 110 and applied to the input of a voltage controlled delay line 120. As shown in FIG. 1, the voltage controlled delay loop 120 interacts with two control loops 150, 160. The first phase control loop 150 is comprised of a VCDL phase detector 130, a digital filter 140 and a current steering DAC 145. Generally, the first control loop 150 adjusts the delays of the voltage controlled delay loop 120. The reference signal and the output of the VCDL 120 are applied to the VCDL phase detector 130 which provides phase detection by producing an output representative of the phase difference that is applied to a filter 140 whose digital output is converted to an analog voltage by the DAC 145 to control the delay in the stages of the voltage controlled delay loop 120.

The second data control loop 160 is comprised of a preamplifier 165, a data sampling block 170, an optional data decimator 175, a parallel data and clock output block 180 and a second order proportional and integral (PI) filter 190. The serial data is received and amplified by the preamplifier 165 and applied to the data sampling block 170. The data sampling block 170 samples the data using the plurality of phases, $T_0, S_0, \ldots T_i, S_i$. The data samples are then applied to the optional data decimator 175 that drops the data rate, for example, by a factor of two. In addition, the data sampling block 170 provides a recovered bit clock output that is applied to the data decimator 175, parallel data and clock output block 180 and second order PI filter 190. The parallel data and clock output block 180 outputs the sampled serial data and recovered lower frequency clock as parallel data (usually 16 or 20 bit wide) and clock. The second order PI filter 190 interprets the transition and sample information associated with the, $T_0$, $S_0$, ... $T_i$, $S_i$ samples to generate phase control information for the VCDL 120. Generally, the phase control information ensures that the transitions are maintained close to the transition points (see FIG. 2).

Figure 2:
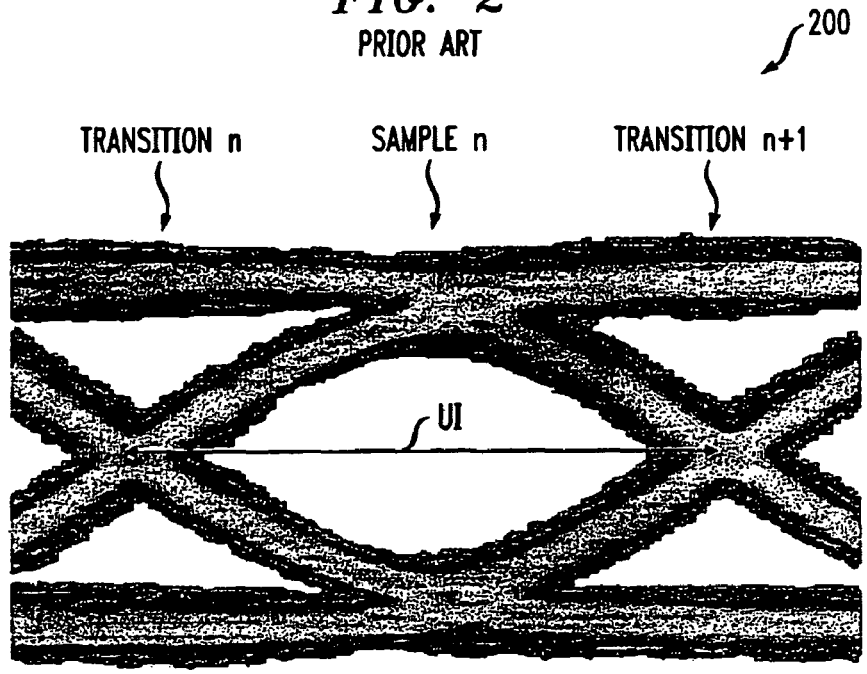
FIG. 2 illustrates the transitions in a data stream.

FIG. 2 illustrates the transitions in a data stream 200. As shown in FIG. 2, the data is ideally sampled in the middle between two transition points. The phases $T_i$, $S_i$ generated by the VCDL 120 are adjusted to align with the transitions and sample points, respectively. Thus, the internal clock is delayed so that the data sampling is adjusted to the center of the "eye," in a known manner.

According to one aspect of the present invention, coarse phase control is provided. In order to control the phase offset between the PLL frequency and data sampling ($S_i$) and transition sampling ($T_i$), the injection point of the PLL frequency into the VCDL 120 is shifted.

Figure 3:
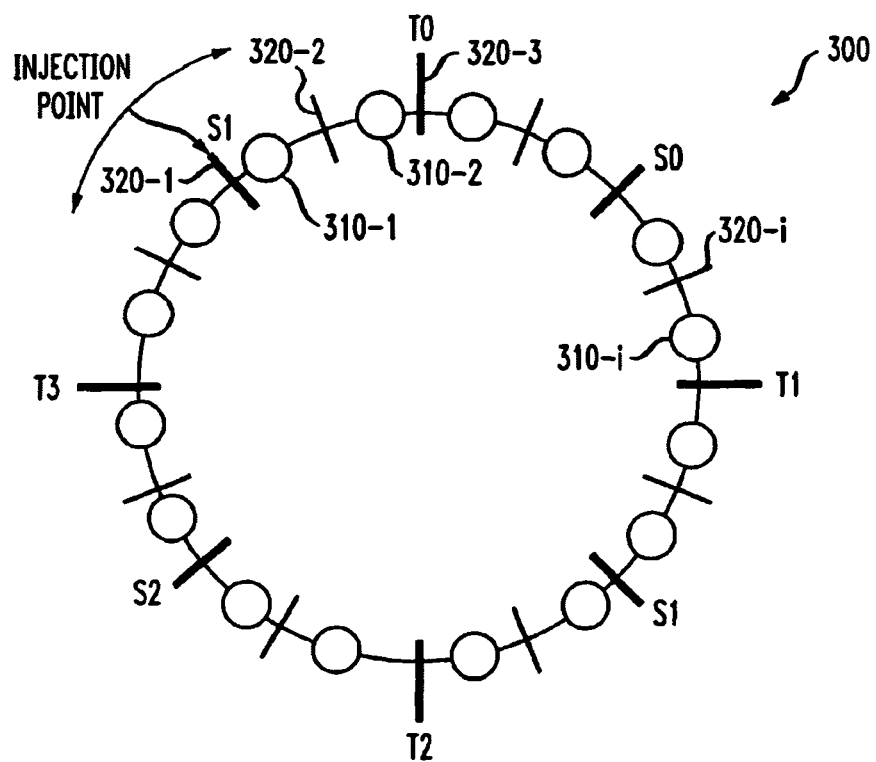
FIG. 3 illustrates a VCDL having coarse phase control in accordance with the present invention.

FIG. 3 illustrates a VCDL 300 having coarse phase control in accordance with the present invention. As shown in FIG. 3, the exemplary VCDL 300 is generally comprised of a succession of a number, such as 16, delay elements 310-1 through 310-16 interconnected in a loop. The exemplary VCDL 300 also includes 16 inputs 320-1 through 320-16 that are each connected to an associated delay line 310-$i$. The correlation between the various phases $T_i$, $S_i$ generated by the VCDL 300 to the delay elements 310 is also shown in FIG. 3. As shown in FIG. 3, the injection point where the PLL signal is applied to the VCDL can be shifted in accordance with the present invention to any input 320-$i$. The delay elements 310 may be embodied, for example, as Complementary Metal-Oxide Semiconductor (CMOS) delay stages.

Figure 4:
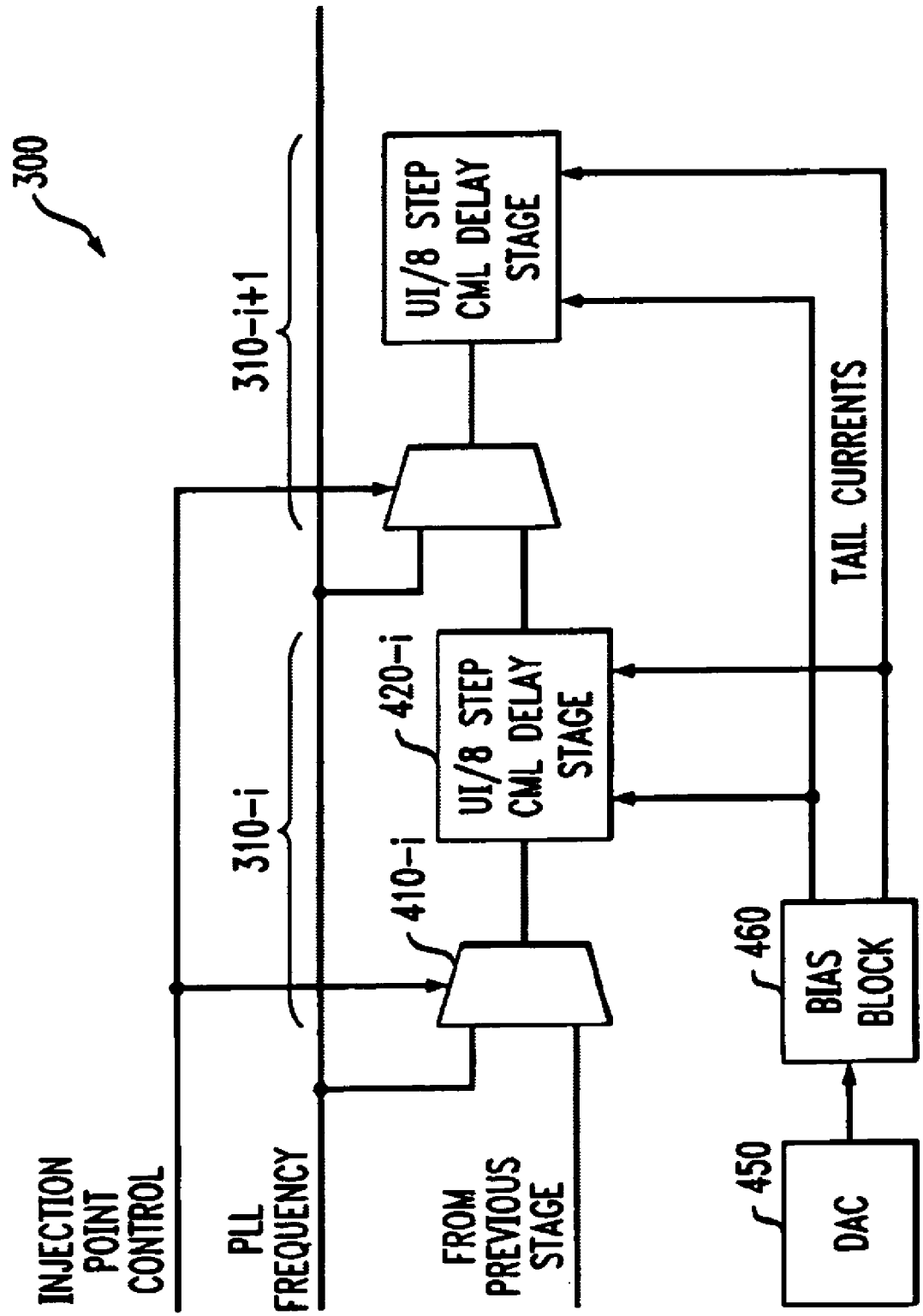
FIG. 4 is a schematic block diagram of an exemplary implementation of the VCDL of FIG. 3.

FIG. 4 is a schematic block diagram of an exemplary implementation of the VCDL 300 of FIG. 3. As shown in FIG. 4, the exemplary VCDL 300 is generally comprised of a succession of delay elements 310-$i$ interconnected in a loop. Thus, the output of the final delay element in the loop, such as element 310-16 in an implementation having 16 delay elements, is connected to the input of the first delay element 310-1 in the loop, in a known manner. Each delay element, such as the delay element 310-$i$, is comprised of a multiplexer 410-$i$ and a delay stage 420-$i$. Each multiplexer 410-$i$ receives the PLL signal at one input and the output of the previous stage at a second input. An injection point control signal controls the multiplexers 410-$i$, such that one selected multiplexer 410 selects the PLL input and all other multiplexers 410 select the input from the previous stage. In this manner, the injection point control is a "one hot" encoded signal ensuring that the PLL frequency is injected into one and only delay element 420-$i$.

The delay stages 420-$i$ may be embodied, for example, using current mode logic (CML) delay stages. In the exemplary implementation having 16 delay elements, each delay stage 420-$i$ should provide a delay equal to one-eighth of the unit interval (i.e., the width of the "eye" in FIG. 2). The exemplary CML delay stages 420-$i$ employ a current steering technique using currents generated by a digital-to-analog converter 450 and bias block 460, in a known manner.

The VCDL 300 of FIGS. 3 and 4 provides a particular phase relation between the PLL frequency and the sampling clocks for each possible injection point. The change in the injection point allows for a control of this phase relation. Among other benefits of the disclosed digital implementation of the present invention is that it provides better linear control of the phase adjustments, and easier transition from one technology to another.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

We claim:

1. A method for generating a clock signal having a desired phase, comprising the steps of:
   selectively injecting a reference clock into any one of a plurality of delay elements; and
   providing an output of said plurality of delay elements as said clock signal
   wherein one or more transitions in said clock signal are substantially aligned to one or more corresponding transitions in received data by said selective injection of said reference clock into one of said plurality of delay elements.

2. The method of claim 1, wherein said plurality of delay elements are connected in series.

3. The method of claim 1, wherein said plurality of delay elements are connected in a loop.

4. The method of claim 1, wherein each of said delay elements has an associated multiplexer and wherein said injecting step further comprises the step of selecting one of said reference clock and a signal from a previous delay element at each of said multiplexers.

5. The method of claim 1, wherein said injection point is shifted to maintain a desired phase relationship between said reference clock and a sample clock.

6. The method of claim 1, wherein said clock signal is used for clock and data recovery.

7. A voltage controlled delay loop, comprising:
   a plurality of delay elements; and
   an input that selectively injects a reference clock into any one of said plurality of delay elements, wherein an output signal of said plurality of delay elements is used as a clock signal for clock and data recovery and wherein one or more transitions in said clock signal are substantially aligned to one or more corresponding transitions in received data by said selective injection of said reference clock into one of said plurality of delay elements.

8. The voltage controlled delay loop of claim 7, wherein said plurality of delay elements are connected in series.

9. The voltage controlled delay loop of claim 7, wherein said plurality of delay elements are connected in a loop.

10. The voltage controlled delay loop of claim 7, wherein each of said plurality of delay elements is a current mode logic delay stage.

11. The voltage controlled delay loop of claim 7, wherein each of said plurality of delay elements is a CMOS delay stage.

12. The voltage controlled delay loop of claim 7, wherein each of said delay elements has an associated multiplexer that selects one of said reference clock and a signal from a previous delay element.

13. The voltage controlled delay loop of claim 12, wherein only one of said multiplexers selects said reference clock at a given time.

14. The voltage controlled delay loop of claim 7, wherein said injection point is shifted to maintain a desired phase relationship between said reference clock and a sample clock.

15. An integrated circuit, comprising:
a voltage controlled delay loop, comprising:
a plurality of delay elements; and
an input that selectively injects a reference clock into any one of said plurality of delay elements, wherein an output signal of said plurality of delay elements is used as a clock signal for clock and data recovery and wherein one or more transitions in said clock signal are substantially aligned to one or more corresponding transitions in received data by said selective injection of said reference clock into one of said plurality of delay elements.

16. The integrated circuit of claim 15, wherein said plurality of delay elements are connected in series.

17. The integrated circuit of claim 15, wherein each of said plurality of delay elements is a current mode logic delay stage.

18. The integrated circuit of claim 15, wherein each of said plurality of delay elements is a CMOS delay stage.

19. The integrated circuit of claim 15, wherein each of said delay elements has an associated multiplexer that selects one of said reference clock and a signal from a previous delay element.

20. The integrated circuit of claim 19, wherein only one of said multiplexers selects said reference clock at a given time.

21. The integrated circuit of claim 15, wherein said injection point is shifted to maintain a desired phase relationship between said reference clock and a sample clock.

* * * * *